US012619143B2

(12) United States Patent
Kommeren et al.

(10) Patent No.: US 12,619,143 B2
(45) Date of Patent: May 5, 2026

(54) APPARATUS AND PROCESS FOR REPLICATING A TEXTURE

(71) Applicant: Morphotonics Holding B.V., Veldhoven (NL)

(72) Inventors: Alexander Sebastiaan Kommeren, Geldrop (NL); Jan Matthijs Ter Meulen, Eindhoven (NL); Bram Johannes Titulaer, Veldhoven (NL)

(73) Assignee: Morphotonics Holding B.V., Veldhoven (NL)

( * ) Notice: Subject to any disclaimer, the term of this patent is extended or adjusted under 35 U.S.C. 154(b) by 0 days.

(21) Appl. No.: 18/006,540

(22) PCT Filed: Jul. 16, 2021

(86) PCT No.: PCT/EP2021/070042
§ 371 (c)(1),
(2) Date: Jan. 23, 2023

(87) PCT Pub. No.: WO2022/023090
PCT Pub. Date: Feb. 3, 2022

(65) Prior Publication Data
US 2023/0294441 A1 Sep. 21, 2023

(30) Foreign Application Priority Data

Jul. 31, 2020 (EP) .................................... 20188855

(51) Int. Cl.
*G03F 7/00* (2006.01)
*B82Y 40/00* (2011.01)
(52) U.S. Cl.
CPC ............ *G03F 7/0002* (2013.01); *B82Y 40/00* (2013.01)

(58) Field of Classification Search
None
See application file for complete search history.

(56) References Cited

U.S. PATENT DOCUMENTS

| | | | | |
|---|---|---|---|---|
| 2003/0180443 A1* | 9/2003 | Ulli | ......................... | B05C 3/125 |
| | | | | 118/115 |
| 2004/0008334 A1* | 1/2004 | Sreenivasan | .......... | G03F 7/0002 |
| | | | | 355/75 |
| 2011/0254205 A1 | 10/2011 | Inamiya | | |
| 2012/0292820 A1* | 11/2012 | Smistrup | ............... | G03F 9/7042 |
| | | | | 264/293 |
| 2013/0214452 A1* | 8/2013 | Choi | ...................... | B82Y 40/00 |
| | | | | 264/293 |
| 2014/0227493 A1 | 8/2014 | Enomoto | | |
| 2019/0329575 A1 | 10/2019 | Ter Meulen | | |
| 2021/0156021 A1 | 5/2021 | Ooshiro | | |

FOREIGN PATENT DOCUMENTS

| | | | | |
|---|---|---|---|---|
| EP | 2823356 B1 | 5/2018 | | |
| KR | 101332323 B1 | 11/2013 | | |
| WO | WO-2018011208 A1* | 1/2018 | ............... | B41K 3/50 |

OTHER PUBLICATIONS

International Search Report and Written Opinion received for PCT Application No. PCT/EP2021/070042 on Feb. 3, 2022, 12 pgs.

\* cited by examiner

*Primary Examiner* — Joshua D Zimmerman
(74) *Attorney, Agent, or Firm* — The Webb Law Firm

(57) ABSTRACT

A process is for replicating a texture. A method continuously produces a flex stamp and applies the flex stamp in texturing a resin by combination of a roll-to-plate and a plate-to-roll process. An apparatus is suited for the continuous process.

14 Claims, 3 Drawing Sheets

APPARATUS AND PROCESS FOR REPLICATING A TEXTURE

CROSS-REFERENCE TO RELATED APPLICATION(S)

This application is a National Stage Application of PCT/EP2021/070042, filed 16 Jul. 2021, which claims benefit of Ser. No. 20/188,855.9, filed 31 Jul. 2020 in Europe, and which applications are incorporated herein by reference. To the extent appropriate, a claim of priority is made to each of the above disclosed applications.

The invention pertains to a method and an apparatus for replicating a texture as well as to products obtained using the process according to the application.

The use of functional textured layers on devices is an important topic. The smart usage of such layers can enhance performance, reduce cost or improve the visual appearance of the product. For example, diffusing layers are used in displays, enabling the use of thinner LED backlight concepts and illuminating the display from the sides. Other new high-tech possibilities are the integration of functional textured layers into solar panels improving their efficiency or integration in organic light-emitting diode (OLED) lighting panels to extract more light.

Functional textured layers can be made by use of UV imprinting. In this case the substrate, or stamp, or both are coated with a lacquer (also called resin or resist). After pressing the stamp on the substrate with lacquer in between, the textured lacquer is cured to a solid phase. The curing method can be thermal or by use of UV light. Already in 1978, this technology was mentioned in U.S. Pat. No. 4,128,369. Further pioneering work was done by Chou in 1995. He demonstrated that by use of a rigid stamp sub-25 nm textures could be replicated at high throughput for mass production (U.S. Pat. No. 5,772,905 or in an article by Stephen Y. Chou, Peter R. Krauss, Preston J. Renstrom (Appl. Phys. Lett. 67 (1995) 3114-3116)). Later-on the use of a roller to apply pressure on either a rigid stamp or a bended thin metal sheet to replicate textures was demonstrated (article Hua Tan, Andrew Gilbertson, Stephen Y. Chou, J. Vac. Sci. Technol., B 16 (1998) 3926-3928).

Many institutes and companies continued this work, resulting in different techniques. In the semiconductor industry plate-to-plate imprinting is applied by using a rigid stamp in combination with a transfer process, materials and precise positioning as described in U.S. Pat. No. 6,334,960, US Patent Application 2004/0065976 and U.S. Pat. No. 8,432,548. The roll-to-roll imprinting technique uses textured rollers in combination with flexible substrates to texture foils or films in a continuous process as described in e.g. the U.S. Pat. No. 8,027,086.

The above-mentioned plate-to-plate technique is designed for the precise, wafer-scale, imprinting of small textures (feature size of sub-100 nm) on uniform flat wafers with high position accuracy. But as described in the Chinese Patent Application CN 103235483, this technology is difficult to scale to a larger area. By use of the roll-to-roll technology textured foils can be made continuously at high production speeds. These textured foils can be used as substrates for flexible applications or can be laminated onto rigid substrates. However, the latter comes at additional cost of an intermediate adhesive layer to adhere the textured flexible foil to the rigid substrate or product. Therefore, a third new technology is being developed: direct roll-to-plate imprinting. Hereby the functional textured layer is directly applied on the discrete substrate without the use of an auxiliary film that has an additional intermediate adhesive layer of tens to hundreds of microns thickness. In contrast to the plate-to-plate technology the imprint is made by use of rollers which are textured or by use of textured foils, also called flexible stamps, wound around rollers.

In contrast to most rigid stamps and imprinting rollers which are usually made of metal, flexible stamps have a shorter lifetime as they are less resistant against mechanical stress for the softness of the polymeric materials they normally consist of. As flexible stamps are normally in contact with the lacquer or resin during the curing or consolidation process they are also exposed to radiation and/or thermal stress which lowers the lifetime of their chemical structure. This requires that flexible stamps have to be replaced more often compared to rigid stamps and imprinting rollers which are often of metal and have a more or less infinite lifetime. This implies that flexible stamps have to be produced much more often and that there is thus a necessity for fast and efficient processes for production thereof.

Typically, flexible stamps are produced by replicating a texture from a rigid master which may consist of wear-resistant materials such as metal, glass or quartz. This master is typically covered with a resin, with a carrier placed on top of the master and the resin is consolidated either thermally or by UV light, the consolidated and the textured resin layer is separated from the master, further treated, e. g. by an additional step to improve its mechanical properties and to diminish its adhesive interaction with the lacquer used in the imprinting process. After this treatment, the textured resin layer may become part of a flexible stamp, can be installed in an apparatus and used for roll-to-plate imprinting of rigid substrates.

The necessity of producing flexible stamps frequently renders roll-to-plate processes time-consuming compared to imprinting processes which use rigid stamps or imprinting rollers. Use of flexible stamps requires know-how of producing the flexible stamp, the equipment of producing the stamp and subsequently applying the flexible stamp for imprinting in a product imprint process and equipment. This limits the application of roll-to-plate processes using flexible stamps to fields where neither plate-to-plate processes nor roll-to-roll processes are applicable e.g. for the reason of the size of the substrate.

It is an object of the invention disclosed in this application to render roll-to-plate imprinting by flexible stamps more efficient by providing an alternative technique for producing a flexible stamp which may also be used with apparatuses which are only suitable for carrying out a roll-to-plate imprinting process.

The object is solved by a method for continuously replicating a texture comprising the steps of providing a substrate, providing a first resin to the substrate, texturing the first resin by an imprint texture applying a roll-to-plate process, consolidating the first resin, with said steps being repeated as often as replications of the texture are needed, characterized in that prior to the replicating process the steps of providing a master with a texture to be replicated with the textured surface of the master having a surface free energy of at most 35 mN/m, providing a second resin to the master, providing a carrier bringing the master and carrier in contact with the second resin in between for texturing the second resin by applying a plate-to-roll process, consolidating the second resin to obtain the imprint texture of step used for texturing the first resin are carried out and further characterized in that while carrying out the step of texturing the first resin, the substrate is moving in the same plane as the master while carrying out the step of bringing the carrier and the master in contact with the second resin.

Throughout this application, the term "continuously" means that a method for producing a product can deliver multiple products without process interruption. In relation with an apparatus carrying out a production process, "continuously" means that the apparatus can carry out the method several times consecutively without being stopped. "Continuously" may furthermore mean that the apparatus can carry out the method several times consecutively without necessity to adjust the curing method, the direction in which the apparatus is working or having the need for additional process modules such as a bake station, anti-stick coating station or flexible stamp storage rack.

Replication of a texture means that a texture which is found on a first surface is transferred to a second surface without changing or damaging the first surface. A texture within the context of the application is any kind of three-dimensional structure found on the first surface. The term "texture" does not pertain to the molecular properties of the surface which includes characteristics such as color or adhesive behavior. The term "texture" refers to the surface texture or sometimes called surface topography which comprises random or periodically structured deviations from an ideal perfectly flat plane. Other wording for persons skilled in the art is relief texture. The texture can be in the range of micrometers or nanometers. The texture may have an optical functionality and then, depending on its size range, be called an optical micron or nano texture. The texture may have a haptic function. The texture can even be a flat surface.

Throughout this application, the term "imprint texture" is used for a texture which is used to produce the texture on the substrate. In the meanings of the process of this application, this means that the imprint texture is the inverse of the texture on the substrate, hence an opening in the texture is an elevation in the imprint texture and an elevation in the texture is an opening in the imprint texture. The imprint texture is thus similar to the texture on a traditional seal which is pressed into molten wax or lacquer.

In the replication method according to the application, the texture of the first surface can be transferred to more than one second surface through an intermediate imprint texture which is the inverse of the texture to be replicated. The replicated texture on the second surface has different properties than the texture on the first surface. The three-dimensional structure on the first surface and the second surface will be the same, but the three-dimensional structure on the second surface may be in a different material than the three-dimensional structure on the first surface. Throughout the remainder of this application, the first surface will be called "master" while the second surface will be called "substrate".

The substrate of the imprinting process can be any kind of material which can be covered by a first resin and which is able to stand the pressure of the roll-to-plate process. Furthermore, the material of the substrate should be compatible with the first resin. In an embodiment, the substrate may be a rigid plate. In an embodiment, the substrate may be a glass plate. In an embodiment, the substrate may be a metal plate. In an embodiment, the substrate may be a resin plate. In an embodiment, the substrate may be a plate made of a composite. In an embodiment, the substrate may be plastic sheet or plastic foil.

The substrate is covered by a first resin. This first resin can be applied in different manners for example by spin-coating, dispense-coating, slot-dye coating, screen-printing, gravure printing, slit-coating or inkjet-printing. Instead of applying the first resin on the substrate, the first resin can also be applied to the imprint texture and be transferred to the substrate by the imprint texture. In an embodiment, the first resin can be consolidated by application of heat and/or UV light. In an embodiment, the first resin shows low adhesion with the material of the imprint texture. In an embodiment, the first resin may be a polymer comprising monomers and/or oligomers such as: epoxides, thiols, polyvinyl resins, acrylates, methacrylates, polyethers, vinylethers, urethane acrylates, polyesters, fluorinated acrylates, fluorinated methacrylates, fluorinated polyethers, siloxanes, siloxane-acrylates or blends thereof. In an embodiment, the first resin may comprise agents for initiating the consolidation such as radical, cationic or anionic initiators. Suitable initiators are known by a person skilled in the art. Possible radical initiators are azo compounds such as azobisisobutyronitrile, peroxides such as dibenzoylperoxide or peroxodisulfate, phosphine oxides such as, diphenylphosphine oxide, aromatic ketones such as 1-hydroxy-cyclohexylphenyl-ketone or 2-Hydroxy-2-methylpropiophenone, or a norrish type II initiator such as methylbenzoylformate. Possible cationic and anionic initiators are benzenesulfonic acid esters, alkylsulfonium salts or photo base generators such as Triphenylsulfonium (cationic), Tetrafluoroborate or 2-Nitrobenzyl Cyclohexylcarbamate (anionic). Depending on the initiator the consolidation may be initiated either thermally or by radiation, e.g. UV.

The layer of first resin on the substrate is textured by an imprint texture which is guided by a roller and on which pressure is exerted by a roller. As the texture is therefore transferred from a roller to a discrete plate, this process is called a "roll-to-plate process".

The first resin is consolidated while it is in contact with the imprint texture. The term "consolidating" means that a liquid or viscous material is exposed to conditions which initiate chemical reactions within the resin which lead to the formation of a solid material e.g. by a polymerization reaction. This kind of material modification is also known under the term "curing" by the person skilled in the art.

For consolidating the first resin, all consolidation techniques known by the skilled artisan may be used such as thermal consolidating or consolidating by radiation. Depending on the chosen consolidation technique the first resin may comprise radical, cationic or anionic initiators. Thermal consolidation may be carried out by heating the first resin to a temperature at which the radical or cationic initiator decomposes and forms radicals or cations which are able to start the polymerization reaction. The heating may be carried out in an oven or e.g. by a source of infrared radiation. Consolidation by radiation is carried out by exposing the first resin to visible light or ultraviolet radiation. By exposure to light the radical or cationic initiator will decompose and emit radicals or cations which are able to start the polymerization reaction. For a consolidation by radiation, a radiation source such as a lamp or a UV lamp is required. It is furthermore required that the radiation of the radiation source can penetrate through the media surrounding the first resin which means that either the substrate or the imprint texture or both have to be transparent for the radiation of the radiation source.

After the first resin has been consolidated, the imprint texture is separated from the consolidated resin. The consolidated resin adheres to the substrate and forms a textured layer on the substrate which is the negative image of the imprint texture. As persons skilled in the art will understand, in the roll-to-plate-process a depression in the imprint texture is transferred to an elevation in the textured resin.

The steps of providing the substrate, providing the first resin to the substrate, texturing the substrate by an imprint texture and consolidating the first resin may be carried out as often as replications of the texture are needed. The upper limit of step repetitions is the mechanical lifetime of the imprint texture which will have to be exchanged if damages occur or signs of wear impact the imprinting results in any other manner.

The master is typically a rigid, planar plate of a durable material. In an embodiment, the master may be made of metals like steel, nickel, copper or aluminum. In an embodiment, the master may be of silicon, quarts or glass. In an embodiment, the master may be a plastic foil or plastic sheet. The master comprises a texture which will be replicated using the method according to the application. The texture to be replicated can be engraved into the surface of the master by any engraving technique like milling. Other mastering techniques are for instance, but not limited to; laser ablation, grey scale lithography, wafer-scale lithography and etching.

In order to allow for easy separation of the carrier with the imprint texture from the master, the master may be treated with an anti-stick agent prior to being provided to the plate-to-roll-process. Possible anti-stick agents may be low-viscosity silicone oils, paraffin oils, fatty oils, aliphatic, siloxane or fluorinated phosphonic acids or aliphatic, siloxane or fluorinated silanes. For carrying out the plate-to-roll process properly, it is required that the anti-stick agent and the second resin do not mix with each other. However, the anti-stick agent may remain on the surface of the imprint texture formed by consolidating the second resin and give it anti-stick properties which can be helpful for carrying out the roll-to-plate process as they simplify separation of the imprint texture and the consolidated first resin. The antistick-agent may be applied by any technique known in the art such as printing, spincoating, spraycoating, dipping, a kiss-roll or vapor deposition.

The textured surface of the master may have a surface free energy of at most 35 mN/m. In an embodiment, the surface free energy of the textured surface of the master is at most 25 mN/m or at most 15 mN/m.

Prior to carrying out the plate-to-roll process according to the application, a second resin will be provided to the master. In an embodiment, the second resin can be consolidated by application of heat and/or radiation. In an embodiment, the second resin shows low adhesion with the material of the master. In an embodiment, the second resin may be a polymer comprising monomers and/or oligomers such as epoxides, thiols, polyvinyl resins, acrylates, methacrylates, polyethers, vinylethers, urethane acrylates, polyesters, fluorinated acrylates, fluorinated methacrylates, fluorinated polyethers, siloxanes, siloxane-acrylates or blends thereof. In an embodiment, the second resin may comprise agents for initiating the consolidation such as radical, cationic or anionic initiators. Suitable radical initiators are known by a person skilled in the art. Possible radical initiators are azo compounds such as azobisisobutyronitrile, peroxides such as dibenzoylperoxide or peroxodisulfate, phosphine oxides such as, diphenylphosphine oxide, aromatic ketones such as 1-hydroxy-cyclohexylphenyl-ketone or 2-Hydroxy-2-methylpropiophenone, or a norrish type II initiator such as methylbenzoylformate. Possible cationic and anionic initiators are benzenesulfonic acid esters, alkylsulfonium salts or photo base generators such as triphenylsulfonium (cationic), tetrafluoroborate or 2-nitrobenzyl cyclohexylcarbamate (anionic). Depending on the initiator the consolidation may be initiated either thermally or by radiation, e.g. UV. The second resin may have intrinsic antistick properties. This means the resin does not need any post treatment after curing and can immediately be used for making imprints by itself. The antistick properties are achieved by the right combination of low surface free energy materials (as example, among others perfluorpolyether (PFPE) monomers, perfluorinated monomers, silicone monomers, and/or aliphatic monomers) and processing conditions as well as the material of the master. Intrinsic anti-stick properties of the second resin may be adapted to either the material of the master or to the anti-stick coating of the master.

Within the context of the present application a carrier can be a flexible, rectangular sheet of material, e.g. a foil, a laminate or a fabric. The carrier may have a front surface and a rear surface. In an embodiment, the carrier is a foil comprising polyethylene terephthalate, polyethylene naphthalate, polycarbonate, polyimide or glass. In an embodiment, the carrier may be a laminate of several foils of the same or different polymeric materials or of a plastic foil and thin glass panels or thin metal sheets. In an embodiment, the dimensions of the carrier are chosen such that it is able to completely cover the textured area of the master, e.g. both the width and the length of the carrier are at least the same as the width and the length of the textured area within the master. In an embodiment, the width and the length of the carrier are larger than the width and the length of the master. If the first resin and/or the second resin are consolidated by light or UV radiation, the carrier may be transparent for visible and/or UV radiation. If the first resin and/or the second resin is consolidated thermally, the mechanical properties of the carrier should not change at the temperature of consolidation.

The carrier is brought in contact with the second resin layer on the master. This second resin can be applied in different manners for example by spin-coating, dispense-coating, slot-dye coating, screen-printing, gravure printing, slit-coating or inkjet-printing. Instead of applying the second resin on the master, the second resin can also be applied on the carrier and the second resin can then be provided to the master upon contacting of the carrier and the master. The second resin is consolidated while the carrier is in contact with the second resin in a way that the carrier covers the layer of second resin on the master with the master being located underneath the carrier and with a layer of second resin being located between the carrier and the master. The surface of the carrier which is brought in contact with the resin may be the front surface. As the carrier may be guided by a roller while the master is a plate, the process of bringing the carrier in contact with the second resin is called a "plate-to-roll" process. As the second resin is consolidated while it is in contact with both the master and the carrier, it will at the same time stick to the carrier and during consolidation take over a negative image of the master where e.g. a depression on the master is transferred into an elevation in the consolidated resin. This way, the imprint texture for the roll-to-plate process is formed. Therefore, the plate-to-roll process is similar to the formation of a dental impression where a negative image is pressed into a soft material which after consolidation serves as a mold for forming a dental model of e.g. plaster. The fundamental difference between the imprint texture according to the application and the dental impression is that the imprint texture is intended for delivering more than one imprint result.

For consolidating the second resin, all consolidation techniques known by the skilled artisan may be used such as thermal consolidating or consolidating by radiation. Depending on the chosen consolidation technique the second resin may comprise radical, cationic or anionic initiators. Thermal consolidation may be carried out by heating the second resin to a temperature at which the radical or cationic initiator decomposes and forms radicals which are able to start the polymerization reaction. The heating may be carried out in an oven or e.g. by a source of infrared radiation. Consolidation by radiation is carried out by exposing the second resin to light, by ultraviolet radiation. By exposure to light the radical, cationic or anionic initiator will decompose and emit radicals, cations or anions, respectively, which are able to start the polymerization reaction. For a polymerization by radiation, a radiation source such as a lamp or a UV lamp is required. It is furthermore required that the radiation of the radiation source can penetrate through the media surrounding the second resin which means that either the master or the carrier or both have to be transparent for the radiation of the radiation source.

After consolidating the second resin, the carrier with the layer of consolidated second resin sticking to it will be separated from the master.

In an embodiment of the method of the application, consolidating the first resin and consolidating the second resin may be carried out using the same thermal and/or radiation conditions. This necessitates that the first resin and the second resin may comprise the same or similar radical initiators. Consolidating the first resin and the second resin using the same thermal or radiation conditions can render an apparatus for carrying out the process according to the application simple in construction and the process itself may be rendered especially efficient. It may comprise e.g. only one lamp, UV lamp, oven or infrared radiation source and possibly even the process parameters of the lamp, UV lamp, oven or infrared radiation source such as wavelength, intensity and/or temperature do not have to be changed when changing from the plate-to-roll-process to the roll-to-place process. Furthermore, adaption to changed parameters such as temperatures do not have to be awaited.

In an embodiment, the process of texturing the first resin and the process of texturing the second surface have an imprint speed between 0.05 m/min and 10 m/min. In an embodiment, the process of texturing the first resin and the process of texturing the second resin have an imprint speed between 0.1 m/min and 5 m/m in. The method according to the application can be carried out especially efficiently if the process of texturing the first resin and the process of texturing the second resin can be carried out at the same imprinting speed as no process parameters have to be modified when changing from the process of texturing the first resin to the process of texturing the second resin or vice versa. This allows for a simple construction of an apparatus which carries out the method according to the application.

The plate-to-roll process and the roll-to-plate process may be carried out using the same, at least one, roller. The at least one roller may be part of an apparatus which is able to carry out both the plate-to-roll process and the roll-to-plate process. The at least one roller may be of cylindrical shape. The at least one roller may be made from all suitable materials known by the person skilled in the art such as metal, in particular steel, ceramic materials such as porcelain, glass, rubber or polymeric materials. The at least one roller may comprise means for heating or cooling the surface of the at least one roller. The at least one roller may comprise a means for exerting a resetting force. The surface of the at least one roller may be smooth. The surface of the at least one roller may be textured.

In an embodiment, there is no fixed connection between the imprint texture and the roller. The roller may exert pressure onto the imprint texture and may guide the imprint texture although the imprint texture is not fixed to the roller.

The imprint texture used in the roll-to-plate process may be part of a flexible stamp. In particular the flexible stamp may comprise the carrier and the consolidated second resin obtained in the plate-to-roll process. The flexible stamp may be produced in the plate-to-roll process and used in the roll-to-plate process. The flexible stamp may be in contact with the at least one roller. The flexible stamp may not need any further treatment between the plate-to-roll process according to the application and the roll-to-plate process according to the application. After the plate-to-roll process according to the application has been completed, the flexible stamp may immediately be ready for use in the roll-to-plate process according to the application. In between the plate-to-roll process according to the application and the roll-to-plate process according to the application, it may not be necessary to remove the flexible stamp from the apparatus such that both the plate-to-roll process and the roll-to-plate process can be carried out in one apparatus. This necessitates that the process for replicating a texture according to the application may be carried out in such a manner that from a procedural point of view, no difference has to be made between the master and the substrate which can be provided to the process in the same manner, in the same direction and in the same orientation. In an embodiment, the master and the substrate are moving in the same plane. Literally speaking, for the apparatus carrying out the process according to the application, there may be no difference between the master and the substrate the apparatus can be run with exactly the same procedural parameters no matter whether a master is provided and a plate-to-roll process is carried out or a substrate is provided and a roll-to-plate process is carried out.

In an embodiment, the carrier and imprint texture together form the flexible stamp.

In an embodiment, the contact between the carrier and/or the flexible stamp on one side and the at least one roller on the other side is frictional. In an embodiment, the contact between the carrier and/or the flexible stamp on one side and the at least one roller on the other side is by adhesion. In an embodiment, the contact between the carrier and/or the flexible stamp on one side and the at least one roller on the other side is by the contact of a texture on the rear side of the carrier and/or flexible stamp and a texture on the roller. The texture on the rear side of the carrier and/or flexible stamp and the texture on the roller may correspond to each other in the manner of gears. In an embodiment, the at least one roller may be moved by the carrier and/or the flexible stamp.

The carrier and/or the flexible stamp may be in contact with at least one driven belt. The contact can for example be made by using a tape, a screw, a clamp and/or a rope. The belt may form a loop. The belt may be connected with one or more driven pulley which move the belt. The moved belt may move the flexible stamp and/or carrier.

The carrier and/or the flexible stamp may be in contact with at least one second roller. The carrier and/or the flexible stamp may be in contact with different rollers at the same time. The functions fulfilled by the first and the second roller during the imprinting process may be different. In an embodiment, the at least one first roller and the at least one second roller both exert pressure on the carrier and/or the flexible stamp.

If the master and the substrate have the same thickness, the process for replicating a texture according to the application may be carried out using an apparatus according to the prior art which is only designed for carrying out the roll-to-plate process.

The application further pertains to an apparatus for replicating a texture comprising at least a first flexible rectangular sheet of material having a front surface and a rear surface, at least one roller being mounted in a mount, sliding means suitable for sliding goods through the apparatus, a gap between the sliding means and the at least one roller, at least one driven belt connected with the flexible rectangular sheet of material and capable of moving the flexible sheet of material with its rear surface over the roller and the front surface between the roller and the sliding means, wherein the mount comprises a means to adjust the gap between the sliding means and the at least one roller.

In an embodiment, the means to change the size of the gap and/or to exert pressure is able to change the size of the gap while the apparatus is under operation which means that the size of the gap can be changed without any necessity for the apparatus to be stopped or maybe even diassembeled in part.

In an embodiment, the means to change the size of the gap and/or to exert pressure is able to vary the size of the gap by 10 mm.

In an embodiment, the gap is suitable for being passed by both the master and the substrate of the process according to the application.

The flexible rectangular sheet of material may serve as a carrier used for carrying out the method for replicating a texture according to the present application.

According to said method the carrier may become a part of a flexible stamp during the plate-to-roll process and it may be used to replicate a structure in the roll-to-plate process.

In an embodiment, the sliding means may be able to move or to convey a master or a substrate according to the method according to the application underneath the at least one roller. Hereby the sliding means give counter-pressure to the upper at least one roller, during the imprint process. In an embodiment, the sliding means is a conveyor belt comprising counter rollers. In an embodiment, the sliding means is a plate sliding underneath the at least one roller, giving counter pressure to the master and/or substrates placed on top of this plate.

In an embodiment, the sliding means may be able to move both the master and the substrate of the process according to the application underneath the at least one roller.

The means to adjust the size of the gap and/or to exert pressure may be a movable stage, moving the at least one roller, in combination with sliding means or a third lower roller moving below or above this plate.

In an embodiment, the means to adjust the size of the gap and/or to exert pressure may comprise at least one screw. In an embodiment, the screw is a spindle.

In another embodiment, the means to adjust the size of the gap and/or to exert pressure is a wedge, possibly moved aside by a screw or spindle.

In an embodiment, the means to adjust the size of the gap and/or to exert pressure may comprise a hydraulic cylinder.

In an embodiment, the means to adjust the size of the gap and/or to exert pressure may comprise a pneumatic cylinder.

In an embodiment, the means to adjust the size of the gap and/or to exert pressure may comprise a linear motor.

Although, adjusting the size of the gap and to exert pressure can be done simultaneously, in embodiments it will be applied separately.

As known by those skilled in the art, the thickness of the master and the substrate may be different or different substrates to be imprinted with the same imprinting pattern may have different thicknesses. The use of masters and substrates of different thicknesses is not possible in the apparatuses of the state of the art. Therefore, one can couple this to means to exert the pressure, because most probably one has to readjust the pressure for different gap settings.

As far as the gap adjustment is concerned and due to the fact that the rollers are mounted in a roller-axis holder (or roller mount), in order to change the gap between the roller and the conveyor belt, this mount can go up and down. Typically, this is done by a spindle, a wedge, a motor, a hydraulic system or pneumatic system.

For the pressure adjustment, in an embodiment counter pressure can be used; meaning the counter pressure which a substrate encounters, once it passes the roller. The substrate will push the roller up. The (counter) roller pressure will push the roller down. This can be achieved by a spring, a spindle, a motor, a pneumatic system, a hydraulic system and the like.

The application also pertains to a product with a textured surface obtained in a method according to the application. For example, the product may be a haptic layer or a light management layer for solar, display, biomedical, architectural or lighting applications.

DESCRIPTION OF FIGURES

The figures show the process according to the application carried out in an apparatus according to the invention. The apparatus comprises a first roller 10, a second roller 11 and guidance rollers 12, a driven belt 7 with a carrier 3 connected to the belt and a UV lamp 4. The first roller is mounted in a mount (13) and equipped with means to adjust the size of the gap (14) as well as means to exert pressure on the roller (15). Furthermore, the apparatus comprises a conveyor belt 8 which is equipped with third lower rollers 8.

Figure 1:
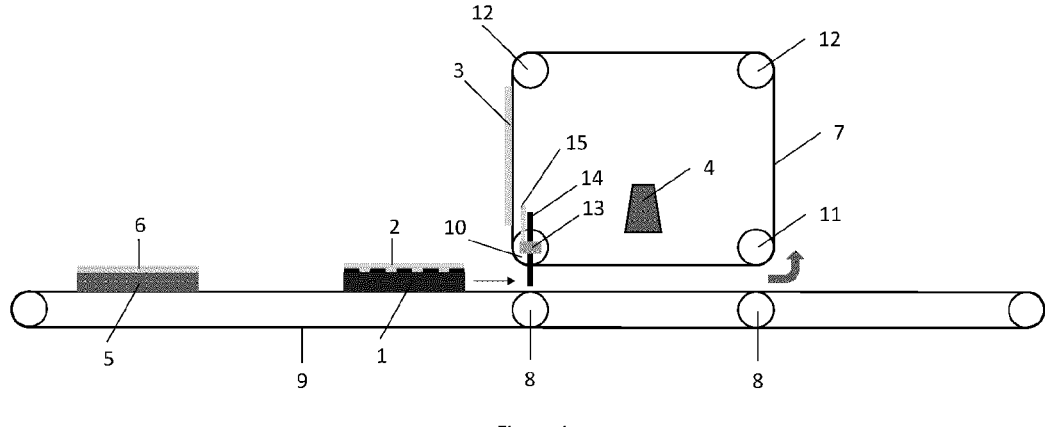
FIG. 1 shows the process of the application on its very beginning with a master 1 with a texture on its surface and a second resin 2 being provided to the master is conveyed on the conveyor belt 9 into the apparatus. A first substrate 5 with a layer of first resin 6 on its surface is conveyed after the master 1.
Figure 2:
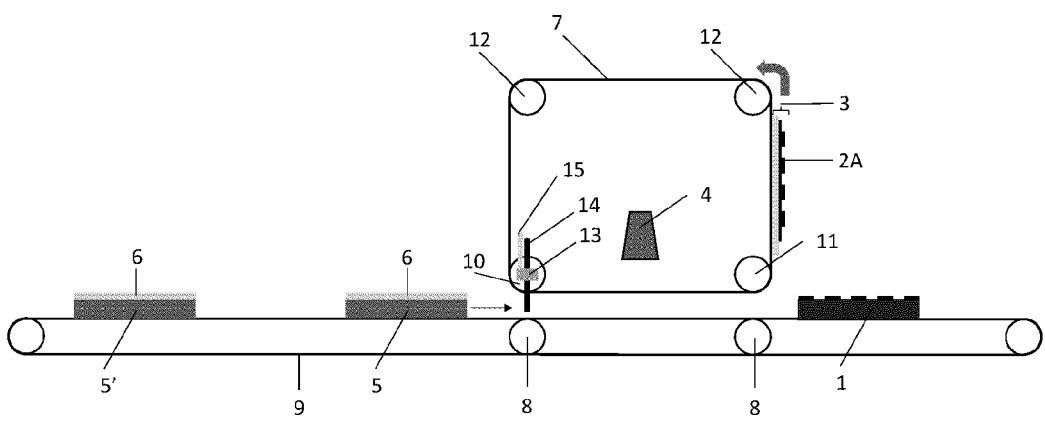
FIG. 2 shows a later step of the process according to the application where the master 1 has already left the apparatus. The second resin has been transferred from its surface onto the carrier where it has turned into a consolidated second resin 2A forming an imprint texture. The carrier 3 and the imprint texture 2A together form a flexible stamp. A first substrate 5 with a layer of first resin 6 on its surface is approaching the apparatus while a second substrate 5' with a layer of first resin on top is conveyed after the first substrate 5.
Figure 3:
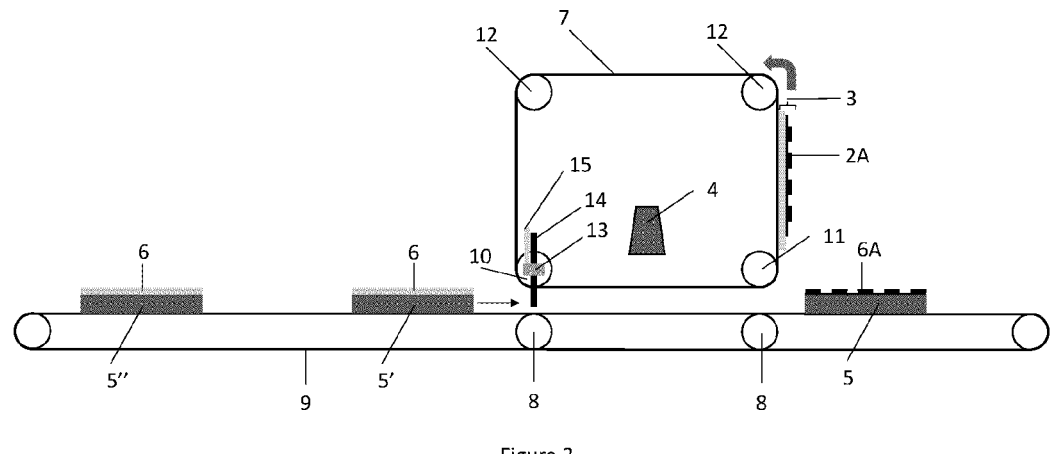
FIG. 3 shows an even later step of the process according to the application where the first substrate 5 has left the apparatus with a consolidated and textured layer of first resin 6A on its surface. The second substrate 5' with a layer of first resin 6 on its surface is approaching the apparatus. Behind the second substrate 5' a third substrate 5" with a layer of first resin on its surface is conveyed to the apparatus.

The invention claimed is:

1. A method of continuously replicating a texture comprising:
(a) providing a a first resin and a second resin;
(b) providing a master comprising a textured surface to be replicated wherein the master is treated with an anti-stick agent prior to being provided, and wherein the textured surface of the master has a surface free energy of at most 35 mN/m;

(c) applying the second resin to the carrier and/or the textured surface of the master, wherein the second resin has antistick properties;

(d) providing a carrier on a belt moving in a first direction past a first roller;

(e) following steps (a)-(d), bringing the master and the carrier into contact while moving over the first roller in the first direction with the second resin between the master and the carrier thereby texturing the second resin on the carrier by applying a plate-to-roll process;

(f) the textured the second resin to form an imprint texture on the carrier;

(g) following steps (e)-(f), providing a substrate;

(h) applying the first resin to the substrate, which first resin differs from the second resin;

(i) following steps (g)-(h), texturing the first resin on the substrate by the imprint texture of the carrier while the carrier on the belt and the substrate are moving over the first roller in the first direction by applying a roll-to-plate process; and (i) consolidating the first resin on while the first resin is in contact with the imprint texture, wherein:

steps (g)-(j) are repeated without interruption plural times, each time with a different substrate, to produce multiple imprinted products, each imprinted product comprising a substrate with a textured and consolidated first resin thereon; and during texturing of the second resin in step (e), the master is moving in said first direction in a first plane, and during texturing of the first resin in step (i), the substrate is moving in said first direction in said first plane.

2. The method of claim 1, wherein the master has a surface free energy of at most 15 mN/m.

3. The method of claim 1, wherein: step (e) includes bringing the master and the carrier into contact via movement of the carrier on the belt and movement of the master by a sliding means in the first direction, such that the master and the carrier move together; and step (f) includes consolidating the textured second resin to form an imprint texture on the carrier while the master and the carrier move together in step (e).

4. The method of claim 1, wherein:

step (i) includes bringing the substrate and the carrier into contact via movement of the carrier on the endless-belt and movement of the substrate by a sliding means in the first direction, such that the substrate and the carrier move together; and step (j) includes consolidating the first resin on the substrate while the substrate and the carrier move together in step (i).

5. The method of claim 1, wherein the at least one first roller is used for the plate-to-roll process and for the roll-to-plate process.

6. The method of claim 1, wherein:

the texturing of the second resin on the carrier in step (e) occurs at an imprint speed between 0.1 m/min and 10 m/min; and the texturing of the first resin on the carrier in step (i) occurs at an imprint speed between 0.1 m/min and 10 m/min.

7. The method according to claim 1, wherein the belt on which in step (d) the carrier is provided is an endless belt.

8. The method according to claim 1, wherein in step (b) the master is provided on a sliding means for sliding the master underneath the first roller, and wherein a gap is defined between the sliding means and the first roller.

9. The method according to claim 8, wherein in step (g) the substrate is provided on the sliding means moving in the first direction.

10. The method of claim 8, wherein the first roller is displaceable relative to the sliding means.

11. The method of claim 8, wherein the sliding means is a conveyor belt or a sliding plate.

12. The method according to claim 1, wherein in step (f) the second resin is consolidated via UV radiation from a UV radiation source.

13. The method according to claim 1, wherein in step (j) the first resin is consolidated via UV radiation from a UV radiation source.

14. The method according to claim 1, wherein in step (i), the imprint texture is directly applied to the first resin in the roll-to-plate process.

\* \* \* \* \*